(12) United States Patent
Shigeto et al.

(10) Patent No.: US 6,406,539 B1
(45) Date of Patent: Jun. 18, 2002

(54) PROCESS FOR PRODUCING SILICON CARBIDE SINGLE CRYSTAL AND PRODUCTION APPARATUS THEREFOR

(75) Inventors: Masashi Shigeto; Kotaro Yano; Nobuyuki Nagato, all of Chiba (JP)

(73) Assignee: Showa Denko K.K,, Tokyo (JP)

(*) Notice: Subject to any disclaimer, the term of this patent is extended or adjusted under 35 U.S.C. 154(b) by 0 days.

(21) Appl. No.: 09/559,550

(22) Filed: Apr. 28, 2000

Related U.S. Application Data
(60) Provisional application No. 60/139,574, filed on Jun. 17, 1999.

(30) Foreign Application Priority Data

Apr. 28, 1999 (JP) .......................................... 11-123228

(51) Int. Cl.$^7$ ............................................... C30B 23/06
(52) U.S. Cl. ........................... 117/88; 117/205; 117/99; 117/108; 117/935; 117/951; 118/715
(58) Field of Search ............... 117/88, 108, 99, 117/935, 951, 205; 118/715

(56) References Cited

U.S. PATENT DOCUMENTS

| | | | |
|---|---|---|---|
| 4,866,005 A | | 9/1989 | Davis et al. ................ 437/100 |
| 5,879,450 A | * | 3/1999 | Lee et al. .................... 117/108 |
| 6,045,613 A | * | 4/2000 | Hunter ......................... 117/951 |
| 6,056,820 A | * | 5/2000 | Balakrishna et al. ........ 117/951 |
| 6,193,797 B1 | * | 2/2001 | Shiomi et al. ............... 117/951 |

FOREIGN PATENT DOCUMENTS

| | | | |
|---|---|---|---|
| JP | 06-316499 | 11/1994 | .......... C30B/29/36 |

* cited by examiner

*Primary Examiner*—Robert Kunemund
(74) *Attorney, Agent, or Firm*—Sughrue Mion, PLLC (57) ABSTRACT

A process for producing a silicon carbide single crystal and a production apparatus therefor which enable, under stable conditions, continuous production of a silicon carbide single crystal which has a reduced density and dispersion of crystal defects in a growth direction, no lattice distortion, a large diameter, and constant quality. A melted or vaporized silicon material is introduced from the outside of a reaction system into a carbon material heated to a temperature equal to or higher than a temperature at which the silicon material vaporizes; and a reaction gas containing silicon gas and silicon carbide gas generated by a reaction between the carbon material and the silicon material is caused to reach a silicon carbide seed crystal substrate 5 which is held at a temperature lower than that of the carbon material, so that a silicon carbide single crystal grows on the silicon carbide seed crystal substrate.

8 Claims, 8 Drawing Sheets

PROCESS FOR PRODUCING SILICON CARBIDE SINGLE CRYSTAL AND PRODUCTION APPARATUS THEREFOR

CROSS REFERENCE TO RELATED APPLICATIONS

This application is an application filed under 35 U.S.C. §111(a) claiming benefit pursuant to 35 U.S.C. §119(e)(1) of the filing date of Provisional Application 60/139,574 filed Jun. 17, 1999 pursuant to 35 U.S.C. §111(b).

FIELD OF THE INVENTION

The present invention relates to a process for producing a silicon carbide single crystal and a production apparatus therefor, in which a silicon material is reacted with a carbon material to yield a silicon carbide single crystal, and more specifically, to a process for producing a silicon carbide single crystal and a production apparatus therefor, in which a melted or vaporized silicon material is introduced into a carbon material in order to generate a silicon carbide gas, which is then caused to reach a silicon carbide seed crystal substrate to thereby grow a silicon carbide single crystal.

BACKGROUND OF THE INVENTION

Since silicon carbide is a substance having a hardness close to that of diamond and considerably high thermal and chemical stability, and serves as a semiconductor material having a wide energy band gap (about 3 eV), silicon carbide has conventionally been used as a polishing material, a refractory material, a heat generating material, or the like, and is expected to be used as a material for elements having high environmental resistance that are usable at elevated temperature, radiation resistance elements, power elements for electrical power control, and short-wavelength light-emitting elements.

A sublimation method is generally used in order to produce a silicon carbide single crystal (see, for example, Japanese Kohyo (PCT) Patent Publication No. 3-501118).

Figure 8:
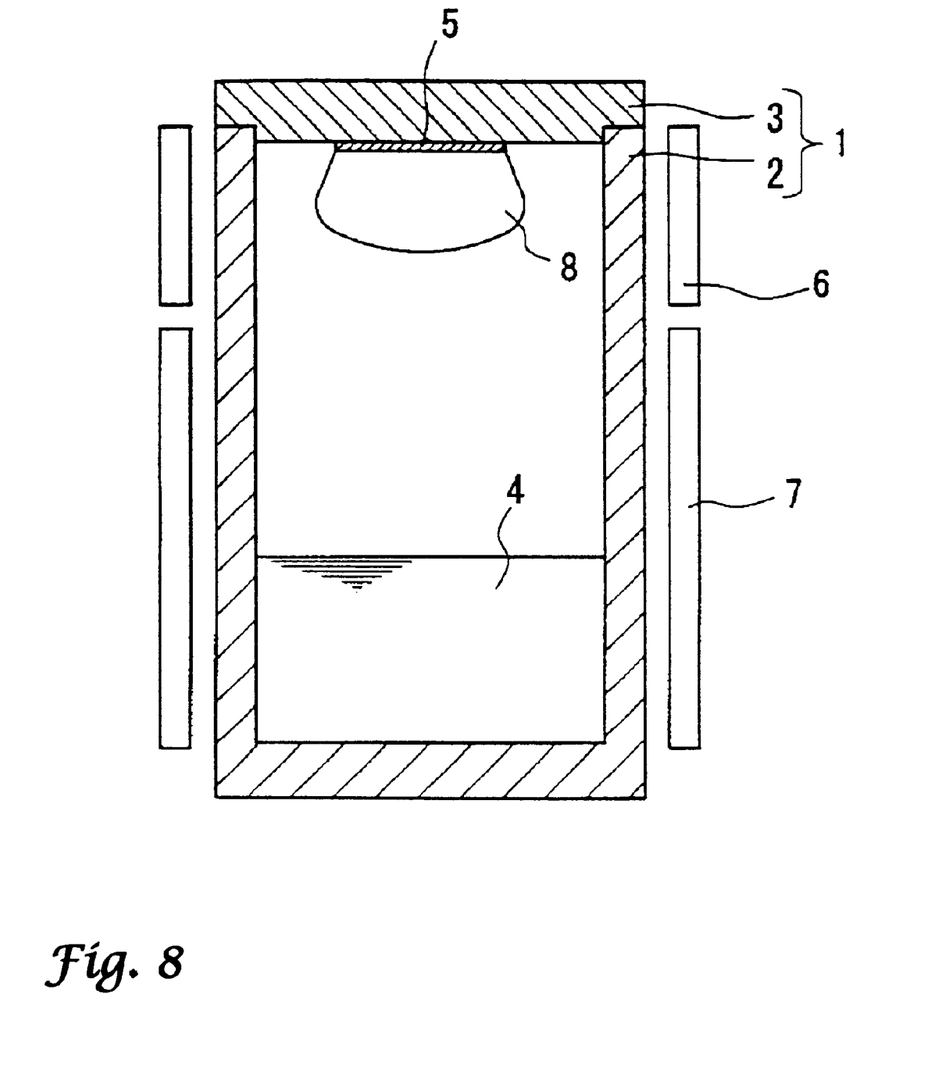
FIG. 8 is a sectional view showing the conventional apparatus for producing a silicon carbide single crystal, in which a sublimation method is employed.

FIG. 8 is a sectional view showing a conventional apparatus for producing a silicon carbide single crystal, in which a sublimation method is employed. In FIG. 8, reference numeral 1 denotes a hollow crucible which is made of graphite and is composed of a crucible body 2 having a closed-bottomed cylindrical shape, and a lid plate 3 removably disposed on the upper end of the crucible body 2. A silicon carbide material 4 in the form of a powder is stored at the bottom of the crucible body 2, and a silicon carbide seed crystal substrate 5 is attached to the lower surface of the lid plate 3. Heating and heat-retaining heaters 6 and 7 are disposed outside the crucible 1, and temperature control is performed such that the temperature of the silicon carbide seed crystal substrate 5 is lower than that of the silicon carbide material 4.

When a silicon carbide single crystal is produced by use of the above-described apparatus, a predetermined amount of the powdery silicon carbide material 4 is placed at the bottom of the crucible body 2, and the silicon carbide seed crystal substrate 5 is attached to the lower surface of the lid plate 3, which is then fixed to the crucible body 2. Subsequently, the interior of the crucible 1 is filled with an inert gas such as Ar to create an inert gas atmosphere, and the silicon carbide material 4 and the silicon carbide seed crystal substrate 5 are heated to respective desired temperatures by use of heaters 6 and 7.

The powdery silicon carbide material 4 decomposes and sublimes due to heat and rises in the form of silicon carbide gas. The silicon carbide gas reaches the silicon carbide seed crystal substrate 5 maintained within a growth temperature region, so that a silicon carbide single crystal 8 is grown epitaxially.

A method in which a silicon carbide single crystal is grown through utilization of reaction between vaporized silicon and solid carbon is also used.

Figure 9:
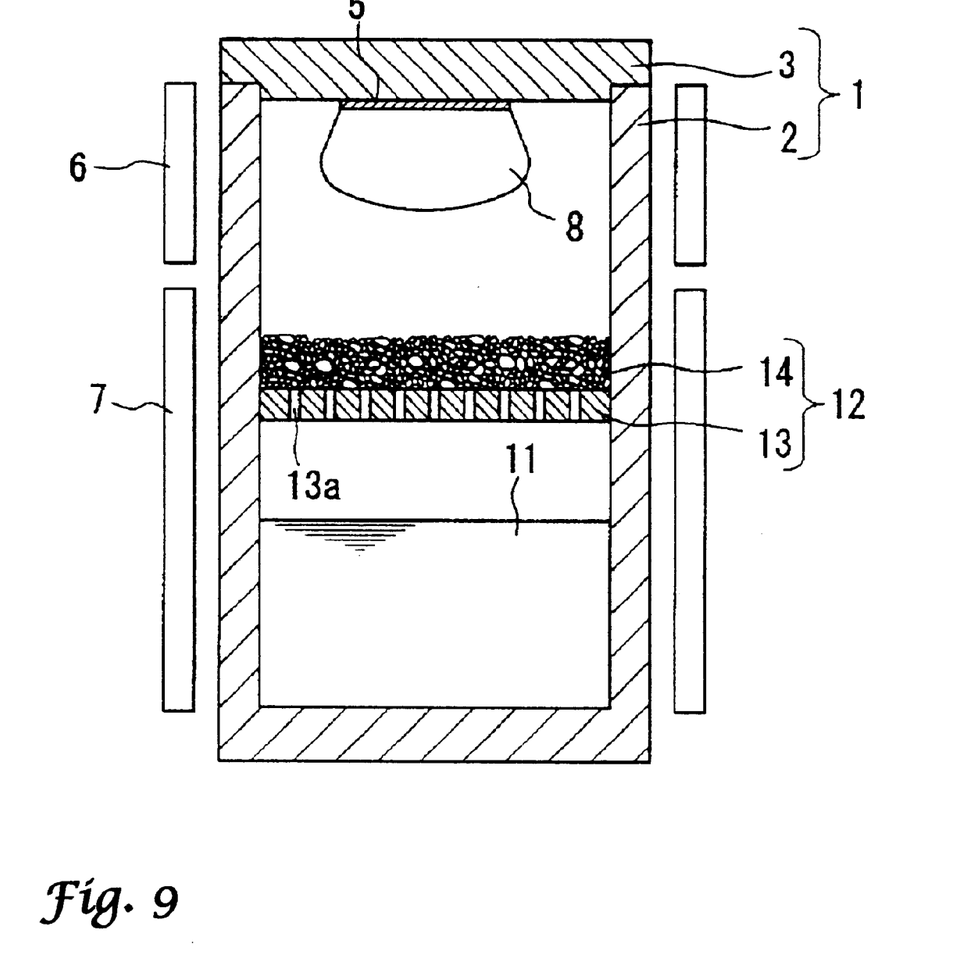
FIG. 9 is a sectional view showing the conventional apparatus for producing a silicon carbide single crystal through utilization of reaction between silicon and carbon.

FIG. 9 is a sectional view showing a conventional apparatus for producing a silicon carbide single crystal through utilization of reaction between silicon and carbon. In FIG. 9, reference numeral 11 denotes a silicon material stored at the bottom of a crucible body 2; and reference numeral 12 denotes a carbon material which is disposed in the crucible body 2 to be located above the silicon material 11 and which reacts with vaporized silicon gas.

The carbon material 12 is composed of a carbon plate 13 having a large number of through holes 13a, and a powdery/granular carbon material 14 charged on the carbon plate 13.

When a silicon carbide single crystal is produced by use of the above-described apparatus, a predetermined amount of the silicon carbide material 11 in the form of granules or powder is placed at the bottom of the crucible body 2, and a silicon carbide seed crystal substrate 5 is attached to the lower surface of a lid plate 3, which is then fixed to the crucible body 2. Subsequently, the interior of the crucible 1 is depressurized. The silicon material 11 is heated by heater 7 such that the silicon material 11 is melted and vaporized, and the silicon carbide seed crystal substrate 5 is heated by heater 6 such that the silicon carbide seed crystal substrate 5 is maintained at a temperature suitable for growth of a silicon carbide single crystal.

Upon being heated, the silicon material 11 is melted and vaporized, so that the silicon material 11 rises in the form of silicon gas and passes through the through holes 13a of the carbon plate 13 and the powdery/granular carbon material 14. While passing through the carbon material 12, the silicon gas reacts with the carbon material 12 to generate a silicon carbide gas. The silicon carbide gas reaches the silicon carbide seed crystal substrate 5 maintained within a growth temperature region, so that a silicon carbide single crystal 8 is grown epitaxially.

However, these conventional methods have a drawback in that silicon gas or molten silicon reacts with graphite, which is the material of the crucible, thereby damaging the crucible. In the worst case, a hole is formed in the crucible, with the result that silicon gas and silicon melt accommodated within the crucible may leak outside, leading to a situation in which the production must be stopped. In this case, the damaged crucible is replaced with a new crucible so that a single crystal can again be grown. However, the expense of purchase of the new crucible for replacement and time loss caused by the operation of heating the new crucible to a temperature required for crystal growth lead to various problems, such as an increase in production cost and a decrease in productivity.

Especially, in the conventional sublimation method, when powdery silicon carbide material 4 is heated, not only SiC, but also Si, $Si_2C$, and $SiC_2$ are generated in the form of decomposition/sublimation gases. Since the amount of the silicon component in the sublimation gas as a whole becomes equimolar or greater with respect to the amount of the carbon component, the composition of the powdery silicon carbide material 4 changes gradually during the course of the sublimation process such that the carbon content becomes in excess. Therefore, when the powdery silicon carbide material 4 sublimes, the partial pressures of the above-described decomposition/sublimation gases change with time, so that crystal defects tend to be generated to a greater extent in a silicon carbide single crystal, with the result that the crystallinity of the silicon carbide single crystal obtained decreases.

Meanwhile, in the conventional single crystal growth method utilizing the reaction between silicon and carbon, the proportions of the respective components of a reaction gas, such as SiC, Si, $Si_2C$, and $SiC_2$, are difficult to accurately control because of difficulty in controlling, to a predetermined amount, the quantity of silicon gas supplied to the carbon material. As a result, generation of crystal defects occurs easily during crystal growth, resulting in decreased crystallinity of the silicon carbide single crystal obtained.

The reason why the amount of silicon gas supplied to the carbon material is difficult to control is as follows. The amount of silicon gas supplied is controlled through control of the amount of silicon material vaporized by the temperature of silicon material. However, since the amount of the silicon material changes with time and the temperature inside the crucible changes, the amount of silicon gas supplied is difficult to control to a constant level.

In order to grow a single crystal of high quality, the temperatures of the carbon material and the silicon carbide seed crystal substrate must be controlled to fall within predetermined temperature ranges. However, when temperature control is performed in order to maintain a constant amount of vaporized silicon material, the temperatures of the carbon material and the silicon carbide seed crystal substrate are affected thereby. Therefore, controlling only the supply amount of the silicon gas to a constant level is difficult in practice.

SUMMARY OF THE INVENTION

The present invention was accomplished in view of the foregoing situation, and an object of the present invention is to provide a process for producing a silicon carbide single crystal and a production apparatus therefor which enables continuous production of a silicon carbide single crystal, which has a reduced density and dispersion of crystal defects in a growth direction, no lattice distortion, a large diameter, and constant quality under stable conditions.

In order to solve the above-described problems, the present invention provides process for producing a silicon carbide single crystal and a production apparatus therefor as described below.

That is, in a first embodiment, the invention provides a process for producing a silicon carbide single crystal comprising introducing a melted or vaporized silicon material from the outside of a reaction system into a carbon material heated to a temperature equal to or higher than a temperature at which the silicon material vaporizes; and causing a reaction gas containing silicon gas and silicon carbide gas generated by a reaction between the carbon material and the silicon material to reach a silicon carbide seed crystal substrate which is held at a temperature lower than that of the carbon material, so that a silicon carbide single crystal grows the silicon carbide seed crystal substrate.

In a second embodiment, the invention provides a process for producing a silicon carbide single crystal according to the first embodiment of the process for producing a silicon carbide single crystal, wherein the carbon material is in the form of a carbon layer filled with powdery/granular carbon material, a porous carbon structure, a carbon plate having many through holes, or any combination of these.

Also in a third embodiment, the invention provides a process for producing a silicon carbide single crystal according to the second embodiment of the process for producing a silicon carbide single crystal, wherein that the powdery/granular carbon material is carbon granules having an average grain size of 100 μm to 5 mm.

In a fourth embodiment, the invention provides a process for producing a silicon carbide single crystal according to the first, second and third embodiment of the process for producing a silicon carbide single crystal, wherein the carbon material contains silicon carbide.

In a fifth embodiment, the invention provides a process for producing a silicon carbide single crystal of the process for producing a silicon carbide single crystal according to any one of embodiments 1 to 4, wherein the temperature range of the silicon carbide seed crystal substrate is 1500–2500° C., the temperature range of the carbon material is set such that the temperature of the carbon material is higher than that of the silicon carbide seed crystal substrate, and the temperature difference between the carbon material and the silicon carbide seed crystal substrate does not exceed 400° C.

In a sixth embodiment, the invention provides a process for producing a silicon carbide single crystal according to embodiments 1 to 5 of the process for producing a silicon carbide single crystal, wherein the silicon material and/or the carbon material is supplied continuously or intermittently.

In a seventh embodiment, the invention provides a process for producing a silicon carbide single crystal according to embodiments 1 to 6 of the process for producing a silicon carbide single crystal, wherein the process includes growing the silicon carbide single crystal simultaneous with a discharging of the reaction gas to the outside of the reaction system and/or moving the grown silicon carbide single crystal to the outside of the reaction system in a volume corresponding to the volume of the silicon material introduced.

The invention also in an eighth embodiment provides an apparatus for producing a silicon carbide single crystal comprising a crucible which stores a carbon material and has a top portion having a lower surface to which a silicon carbide seed crystal substrate is attached; heating means for elevating and maintaining the temperature of the crucible; a material container for storing a silicon material and for elevating and maintaining the temperature of the silicon material; and a silicon introduction tube for introducing from the material container into the crucible the silicon material in a molten or vaporized state.

In a ninth embodiment, the invention provides an apparatus for producing a silicon carbide single crystal according to the apparatus for producing a silicon carbide single crystal according to embodiment 8, wherein at least the inner wall of the crucible is formed of silicon carbide.

The invention in a tenth embodiment provides an apparatus for producing a silicon carbide single crystal according to the apparatus for producing a silicon carbide single crystal according to embodiment 8, wherein at least the inner wall of the silicon introduction tube is formed of silicon carbide and/or a composite material thereof.

The invention in an eleventh embodiment provides an apparatus for producing a silicon carbide single crystal according to the apparatus for producing a silicon carbide single crystal according to embodiments 8, 9 or 10, wherein the carbon material is disposed at a plurality of stages provided along the flow direction of the silicon material.

In a twelfth embodiment, the invention provides an apparatus for producing a silicon carbide single crystal according to the apparatus for producing a silicon carbide single crystal according to embodiments 8, 9, 10 or 11, wherein the heating means comprises a first heating means for elevating and maintaining the temperature of the carbon material and a second heating means controlled independently of the first heating means and adapted to elevate and maintain the temperature of the silicon carbide seed crystal substrate.

DESCRIPTION OF THE PREFERRED EMBODIMENTS

In the process for producing a silicon carbide single crystal according to the present invention, a melted or vaporized silicon material is introduced from the outside of a reaction system into a carbon material heated to a temperature equal to or higher than a temperature at which the silicon material vaporizes, whereby the quantity of the silicon material supplied with respect to the carbon material is controlled to a desired amount. This enables the proportions of the respective components of a reaction gas containing silicon carbide gas and silicon gas to be maintained constant.

Since the proportions of the respective components of the generated reaction gas are held constant, when the reaction gas reaches the silicon carbide seed crystal substrate maintained at a temperature lower than that of the carbon material, a silicon carbide single crystal in which density and dispersion of crystal defects in a growth direction are reduced can be easily formed on the silicon carbide seed crystal substrate.

The reason for this is that when temperature, pressure, and like conditions are selectively controlled in order to establish crystal growth conditions suitable to the proportions of the respective components of the reaction gas, the proportions of the respective components of the reaction gas can be maintained constant, so that control is facilitated and stabilized.

As a result, the density of crystal defects in the obtained silicon carbide single crystal can be decreased to a desired level; i.e., $5.0 \times 10/cm^2$ or less.

The silicon material may be silicon which is generally sold in the market and which has a purity corresponding to the quality of a silicon carbide single crystal to be produced. For example, when a silicon carbide crystal for semiconductors having high resistivity is produced, highly pure silicon such as semiconductor-grade silicon having a purity of 99.999999% or higher is preferably used, because suppression of crystal defects and control of valence electrons are easy.

Amorphous carbon such as glass-like carbon or graphite is preferably used as the carbon material.

The carbon material may have a purity corresponding to the quality of a silicon carbide single crystal to be produced. In order to increase the purity of the carbon material, the carbon material is subjected to carbonization treatment at 2500° C. or higher, and is then subjected to purification treatment at 2000° C. or higher by use of halogen gas or the like.

The carbon material may assume any configuration insofar as the configuration causes efficiently contact reaction with silicon gas and enables easy flow of the gas through the carbon material. Preferably, the carbon material is in the form of a carbon layer, a porous carbon structure, a carbon plate having many through holes, or any combination of these, which are filled with powdery/granular carbon material.

In addition to a carbon plate having many through holes, a carbon plate having many holes/pores, a carbon plate having a high porosity, or a combination of these plates may be used as the carbon plate.

The carbon plate may have a structure such that a porous carbon material having a high specific surface area or a powdery/granular carbon material in the form of a carbon layer is provided on perforated carbon.

The powdery/granular carbon material may be in the form of primary particles in the "as crushed" state, agglomerates, or granules, each of which preferably has an average grain size of 100 $\mu$m to 5 mm. When the grain size is less than 100 $\mu$m, the powdery/granular carbon material passes through the perforated plate and becomes unable to be held thereby. In addition, the flow rate of the silicon gas passing through the powdery/granular carbon material decreases, resulting in a decreased crystal growth rate. When the grain size is greater than 5 mm, the area of contact with the silicon gas decreases, the portion of the silicon gas that passes through the powdery/granular carbon material without causing a reaction increases, and the reaction between the powdery/granular carbon material and the silicon gas does not proceed uniformly, with the result that the composition of a grown silicon carbide single crystal deviates from the stoichiometric composition.

Further, the carbon material may be formed of carbon only or of a material containing carbon as a main component. Silicon carbide may be incorporated into the carbon material in advance. For example, the carbon material may be a mixture of a powdery/granular carbon material and a powdery/granular silicon carbide material. Further, the carbon material may coexist with silicon carbide that is generated from silicon and carbon during crystal growth.

Preferably, the silicon carbide seed crystal substrate is a crystal of silicon carbide having the same crystalline structure as that of a silicon carbide single crystal to be grown. The crystal plane of the seed crystal substrate to be grown preferably has a plane orientation suitable for a silicon carbide single crystal to be grown. For example, a plane perpendicular to the C axis ({0001} plane), a plane parallel to the C axis ({1100} plane), or the like is preferably used. The surface of the silicon carbide seed crystal substrate is preferably made flat through polishing in order to grow a single crystal having a uniform distribution throughout the cross section.

A silicon carbide single crystal which is generally available in the market may be used unless a high quality silicon carbide single crystal having a high purity and no crystal defects must be grown. For example, a substrate or a seed crystal which is machined from a silicon carbide single crystal that is obtained in accordance with, for example, an Acheson method, a sublimation method, or the production process according to the present invention can be used. For epitaxial growth, the crystal plane of the seed crystal substrate is preferably the (1000) plane. However, a seed crystal which is machined such that its crystal plane deviates from the (1000) plane may be used.

The temperature range of the silicon carbide seed crystal substrate is preferably 1500–2500° C., and is more preferably 1700–2300° C. from the viewpoint of control of polytype of a crystal and growth rate control.

The reason for this that when the temperature of the seed crystal substrate is lower than 1500° C., the reactivity between silicon and carbon decreases, and unreacted silicon reaches the surface of the seed crystal substrate. Therefore, as compared with a single crystal in which the atomic ratio between carbon and silicon is 1:1, a grown single crystal has a silicon-rich composition, which deviates from the stoichiometric composition. Further, low temperature tends to allow intermingling of polytype.

When the temperature of the seed crystal substrate is higher than 2500° C., a variety of crystal defects are easily introduced and polytype easily takes place.

The temperature range of the carbon material is preferably set such that the temperature of the carbon material is higher than that of the silicon carbide seed crystal substrate, and the temperature difference between the carbon material and the silicon carbide seed crystal substrate does not exceed 400° C. When the temperature difference between the carbon material and the silicon carbide seed crystal substrate exceeds 400° C., crystal defects and lattice distortion are introduced in a silicon carbide single crystal under growth.

When the above-described points are taken into consideration, the temperature range of the carbon material is preferably set such that the temperature of the carbon material becomes 1600° C. or higher, and the temperature difference between the carbon material and the silicon carbide seed crystal substrate does not exceed 400° C. Further, when the partial pressure of the silicon material is taken into consideration, the temperature range of the carbon material is more preferably 1700–2600° C.

In order to increase the area of contact with the flowing silicon material, the carbon material is preferably disposed at a plurality of stages provided along the flow direction of the silicon material. Further, when the carbon material at the last stage is formed of silicon carbide or a mixed powder of the carbon material and silicon carbide granules, Si, $Si_2C$, $SiC_2$, SiC, and the like are generated as a reaction gas when the silicon material passes through the final stage. As a result, sublimation of the silicon carbide seed crystal substrate and formation of a surface inclusion can be prevented.

When the carbon material is supplied continuously, the carbon material is preferably supplied to a stage before the final stage, because this prevents the drawback that fine particles of carbon generated upon supply of the carbon material scatter and adhere to the silicon carbide seed crystal substrate.

An apparatus for producing a silicon carbide single crystal according to the present invention comprises: a crucible which stores a carbon material and has a top portion having a lower surface to which a silicon carbide seed crystal substrate is attached; heating means for elevating and maintaining the temperature of the crucible; a material container for storing a silicon material and for elevating and maintaining the temperature of the silicon material; and a silicon introduction tube for introducing from the material container into the crucible the silicon material in a molten or vaporized state. Therefore, the silicon material in a molten or vaporized state can be introduced directly into the carbon material stored in the crucible, so that the quantity of the silicon material supplied with respect to the carbon material can be controlled to a desired amount. As a result, the proportions of the respective components of the reaction gas are maintained constant.

When the reaction gas contacts the silicon carbide seed crystal substrate, a silicon carbide single crystal which has a decreased density and dispersion of crystal defects, no lattice distortion, and whose composition coincides with the stoichiometric composition can be grown.

Thus, over a long period of time, a silicon carbide single crystal which has a decreased density and dispersion of crystal defects in the growth direction, no lattice distortion, and constant quality can be produced in a stable manner.

When at least the inner wall of the crucible is formed of silicon carbide, the fear of the crucible being damaged by silicon is eliminated.

For example, when a hole is formed in the crucible, silicon gas and silicon melt accommodated within the crucible may leak to the outside, leading to a situation in which the production must be stopped. The present invention eliminates such a fear. In addition, the expense for purchase of the new crucible for replacement and the time loss caused by an operation of heating the new crucible to a temperature required for crystal growth, which have been considered a problem in the past, can be eliminated. Accordingly, drawbacks such as an increase in production costs and a decrease in productivity can be minimized or eluminated.

Embodiments of the process for producing a silicon carbide single crystal and the production apparatus therefor according to the present invention will be described with reference to the drawings.

Figure 1:
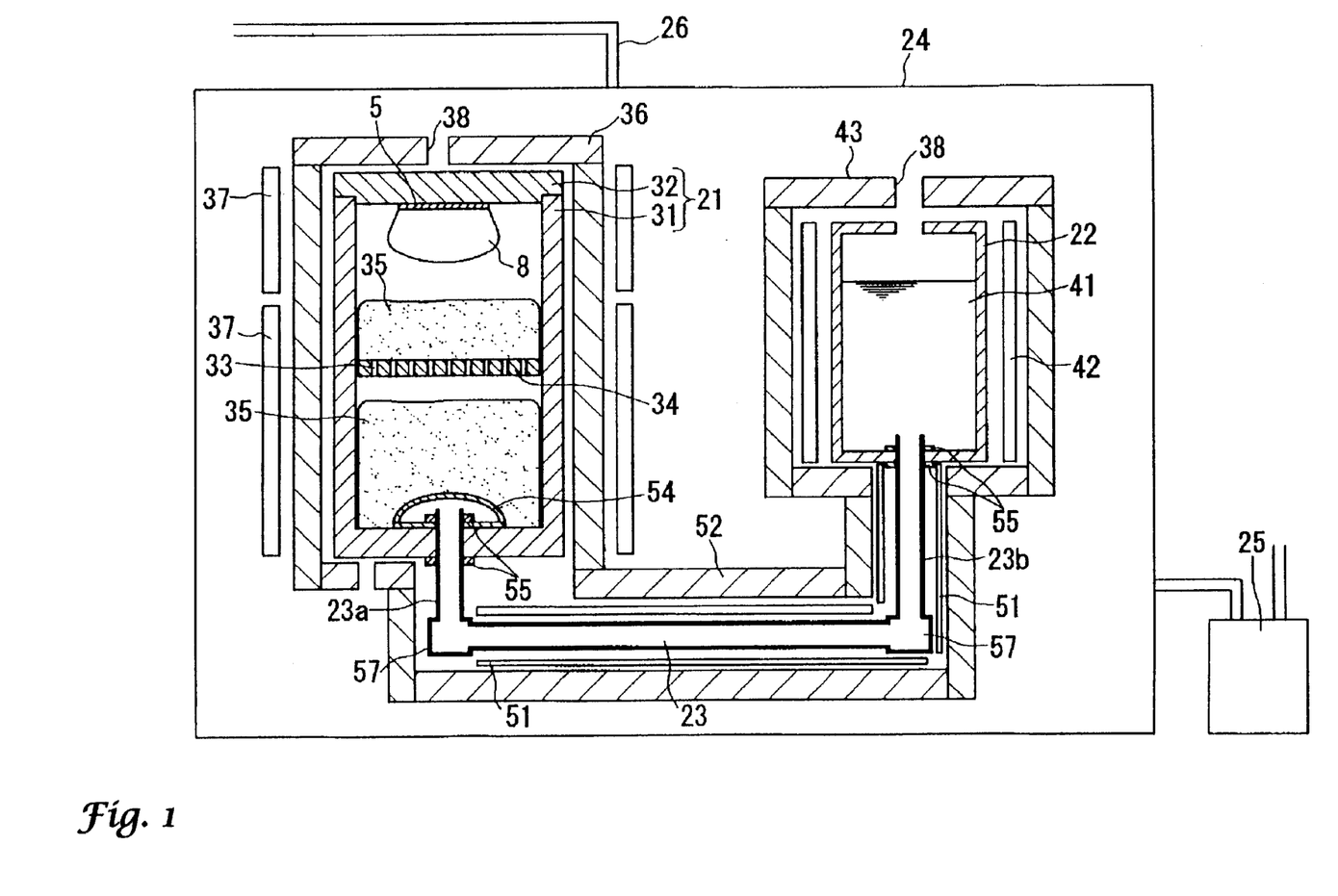
FIG. 1 is a sectional view showing the reaction apparatus for producing a silicon carbide single crystal according to the first embodiment of the present invention.
Figure 2:
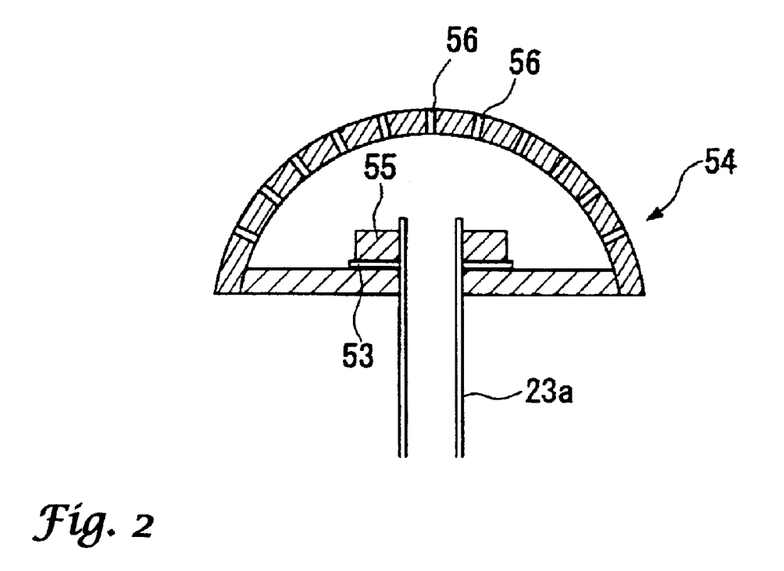
FIG. 2 is an enlarged sectional view of a main portion of the reaction apparatus for producing a silicon carbide single crystal according to the first embodiment of the present invention.

FIG. 1 is a sectional view showing a reaction apparatus (production apparatus) for producing a silicon carbide single crystal according to a first embodiment of the present invention, and FIG. 2 is an enlarged sectional view of a main portion of the apparatus. In FIGS. 1 and 2, reference numeral 21 denotes a crucible made of graphite; 22 denotes a material container made of graphite; 23 denotes a silicon introduction tube made of silicon carbide; 24 denotes a housing which accommodates the crucible 21, the material container 22, and the silicon introduction tube 23, and whose interior can be depressurized; 25 denotes a gas discharging device provided on the housing 24 and adapted to control the internal pressure of the housing 24; and 26 denotes a line for introducing inert gases such as Ar and $N_2$ in order to control the atmosphere within the housing 24. The internal pressure of the housing 24 is controlled within a range from a reduced pressure to a pressure near normal pressure, through balanced control of the gas introduction and the gas discharge.

The crucible 21 is composed of a crucible body 31 made of graphite and having a closed bottom and a lid plate 32 made of graphite. A carbon plate 34 having a large number of through holes 33 for allowing passage of gas is disposed horizontally within the crucible body 31. A powdery/granular carbon material is deposited on the carbon plate 34 and at the bottom of the crucible body 31 so that a carbon layer 35 is formed on the carbon plate 34 and another carbon layer 35 is formed on the bottom of the crucible body 31. Further, a silicon carbide seed crystal substrate 5 is attached to the center portion of the lower surface of the lid plate 32. The (1000) plane of the silicon carbide seed crystal substrate 5 serves as a crystal surface on which a silicon carbide single crystal 8 is grown.

Since the crucible 21 is heated to high temperature, the circumference of the crucible 21 is covered with an insulating member 36 formed of carbon fibers. A space may be formed between the insulating member 36 and the crucible 21. Around the insulating member 36 is wound a high-frequency coil (heating means) 37 for elevating and maintaining the temperature of the crucible 21. The temperatures of the carbon layers 35 and the silicon carbide seed crystal substrate 5 within the crucible 21 are controlled as follows. The high-frequency coil 37 is divided into a portion corresponding to the carbon layers 35 and a portion corresponding to the silicon carbide seed crystal substrate 5, and these divided portions are controlled such that the overall temperature gradient within the crucible 21 has a desired value.

A temperature measurement hole 38 is formed at the center of the top wall of the insulating member 36 in order to allow an unillustrated radiation thermometer to measure the temperature of the crucible 21.

The material container 22 is adapted to store and heat silicon 41 serving as a source material as well as to maintain the temperature such that the silicon is in a melted state. A graphite heater 42 for elevating and maintaining the temperature of the silicon 41 is disposed to surround the material container 22. The material container 22 and the graphite heater 42 are covered with an insulating member 43 made of carbon fibers in order to provide a heat shield around them. The temperature of the silicon 41 is measured from above by use of a radiation thermometer (not shown).

A temperature measurement hole 38 is formed at the center of the top wall of the insulating member 43 in order to allow an unillustrated radiation thermometer to measure the temperature of the silicon 41. The material container 22 may be disposed in side or outside the reaction apparatus.

The material container 22 may be any container that can withstand the temperature of the silicon 41 in a molten state and does not deteriorate the purity of the silicon 41 accommodated therein, which deterioration would otherwise occur due to elution of the material of the container or gas generated therefrom. For example, a graphite container, a graphite container having a quartz crucible placed in the container, a graphite container whose inner wall is coated with silicon carbide, or a silicon carbide container is preferably used.

The silicon introduction tube 23 is adapted to introduce from the material container 22 to the bottom of the crucible 21 the silicon 41 in a molten state. A tubular graphite heater 51 for raising and maintaining temperature is disposed around the silicon introduction tube 23. The silicon introduction tube 23 and the graphite heater 51 are covered with an insulating member 52 made of carbon fibers in order to provide heat insulation.

As shown in FIG. 2, a packing member 53 made of carbon fiber felt is fitted onto one tip-end portion 23a of the silicon introduction pipe 23. The packing member 53 serves as a high-density sealing member in order to prevent leakage of the silicon 41 in a molten or gaseous state. The tip end portion 23a is secured to a sparger 54 via the packing member 53, by use of a nut 55 made of the same material as that of the silicon introduction pipe 23. The sparger 54 is made of silicon carbide and is provided at the bottom of the crucible body 31. In the sparger 54 are formed a large number of holes 56, which are properly adjusted in order to introduce the silicon 41 into the crucible 21 while gasifying the silicon 41.

Like the tip end portion 23a, the other tip end portion 23b is secured to the bottom of the material container 22 via a packing member (not shown) and by use of a nut 55.

L-shaped bent portions of the silicon introduction tube 23 are difficult to machine when the silicon introduction tube is treated as a single unit. Therefore, elbows 57 are fabricated from the same material as that of the silicon introduction tube 23, and are screw-engaged with the tube 23 with a packing material disposed therebetween. Thus, the L-shaped bent portions are formed.

The material of the silicon introduction tube 23 may be any one of the materials which will be described later and which can withstand high temperature and does not deteriorate the purity of the silicon 41 flowing inside the tube 23, which deterioration would otherwise occur due to elution of the material or gas generated therefrom. For example, silicon carbide, quartz, graphite, and like materials may be used singly or in combination of two or more.

The joint portion between the silicon introduction tube 23 and the crucible 21 and the joint portion between the silicon introduction tube 23 and the material container 22 each have a structure for preventing molten or gasified silicon 41 from leaking to the outside; e.g., a screw fixing structure. The packing member is preferably made of a material having not only heat resistance but also good sealing performance at high temperature, and more preferably has a capability of absorbing the difference in thermal expansion between materials having different coefficients of thermal expansion. For example, a compressed sheet of foamed graphite and high-density carbon fiber felt is preferably used.

The total internal pressure of the housing 24 is preferably controlled within a pressure range from a highly reduced pressure to a pressure slightly higher than normal pressure; e.g., from 0.01 to 1000 Torr. When the crucible 21 is made of graphite, the total internal pressure of the crucible 21 becomes substantially equal to that of the housing 24, because graphite has gas permeability.

The sparger 54 has an orientation and shape that are effective for dispersing silicon gas such that the gaseous silicon 41 and the carbon layer 35 contact each other uniformly and efficiently within the crucible 21. For example, there may be employed a structure in which fine holes are radially formed in a conical member, a structure in which fine holes are formed in a pipe-shaped member, or a structure in which a plurality of these members are combined.

Specific examples of the sparger 54 include a perforated plate of silicon carbide, sintered silicon carbide having a low bulk density, and silicon carbide having fine holes formed therein.

Next, a process for growing a silicon carbide single crystal by use of the reaction apparatus according to the present embodiment is described.

First, silicon 41 serving as a source material is placed in the material container 22, which is then heated to a predetermined temperature by use of the graphite heater 42 (or an induction heating device) to thereby melt the silicon 41.

The silicon introduction tube 23, which connects the material container 22 and the crucible 21, is heated to at least 1414° C. (the melting point of silicon 41) in order to prevent solidification of the silicon 41. Any heat source may be used insofar as the selected heat source can heat the silicon introduction tube 23 to 1414° C. or higher. For example, a graphite heater is preferably used.

The silicon 41 within the material container 22 is melted and the surface level of the silicon 41 is set higher than the connection portion between the crucible 21 and the silicon introduction tube 23. Thus, the molten silicon 41 is supplied from the material container 22 into the crucible 21 via the silicon introduction tube 23.

At this time, in accordance with the siphon principle, the piping position of the silicon introduction tube 23 can be set higher than the surface level of the silicon 41 and the connection portion between the crucible 21 and the silicon introduction tube 23. Alternatively, the interior of the material container 22 may be pressurized by use of an inert gas in order to achieve pressurized feeding of the molten silicon 41 from the material container 22 into the crucible 21 via the silicon introduction tube 23.

Subsequently, when the silicon 41 in a molten state is introduced into the crucible 21, the silicon 41 is vaporized so that the silicon 41 in a gaseous state contacts the carbon plate 34 and the carbon layers 35, which serve as a carbon material, within the crucible 21. The vaporization of the silicon 41 is performed by the sparger 54 provided at the exit of the silicon introduction tube 23 connected to the crucible 21.

The silicon 41 in a molten state is gasified when the temperature of the sparger 54 is set to a temperature equal to or higher than the temperature at which the silicon 41 vaporizes under the total internal pressure; e.g., a temperature as high as the temperature of the carbon layers 35.

At this time, the molten silicon 41 introduced into the crucible 21 receives a pressure for introduction. Therefore, the fine holes of the sparger 54 are adjusted in size so as to prevent the molten silicon 41 from being introduced into the crucible 21 as is and remaining therein.

Gaseous silicon 41 vaporized and dispersed from the sparger 54 contacts and reacts with the heated carbon plate 34 and carbon layers 35 uniformly and efficiently, so that the gaseous silicon 41 becomes silicon carbide gas.

When carbon powder is used, a plurality of perforated plates, carbon powder being deposited on each, may be disposed in order to increase the area of collision contact between silicon gas and carbon.

Next, the temperature control for the carbon layers 35 is described.

The temperatures of the carbon plate 34 and the carbon layers 35, which serve as a carbon material within the crucible 21, and the temperature of the silicon carbide seed crystal substrate 5 are preferably controlled such that the overall temperature gradient has a desired value. For example, in a high-frequency furnace, the high-frequency coil 37 is wound such that the density of winding increases at side-surface portions of a crucible corresponding to the carbon material and the silicon carbide seed crystal substrate 5. Alternatively, the high-frequency coil 37 may be divided into a portion corresponding to the carbon material and a portion corresponding to the silicon carbide seed crystal substrate 5.

The growth mechanism of a silicon carbide single crystal, i.e., a mechanism in which silicon gas contacts carbon, and a silicon carbide crystal is grown on the silicon carbide seed crystal substrate 5 as a silicon carbide single crystal 8, is complicated. It has been theorized that when the gaseous silicon 41 within the crucible 21 causes contact reaction with the carbon plate 34 and the carbon layers 35 as well as with carbon gas within the carbon layers 35, not only SiC, but also other components such as Si, $Si_2C$, and $SiC_2$ are generated in the gaseous phase as a reaction gas.

The proportions of the respective components of the reaction gas can be adjusted through combined control of conditions such as the feed rate of silicon, the temperature of the carbon material, the internal pressure of the crucible, and the pressure of the inert gas. When optimal conditions are selected in accordance with the above-described temperature conditions, etc., as well as the capacity, structure, etc., of the apparatus, the silicon carbide single crystal 8 can be stably grown on the surface of the silicon carbide seed crystal substrate 5.

For actual crystal growth, a method in which a silicon carbide single crystal is grown while the distance between the carbon material and the growing point of the silicon carbide single crystal is maintained constant may be employed.

When the distance between the carbon material (the carbon plate 34 and the carbon layers 35) and the growing point of the silicon carbide single crystal 8 is maintained constant while the silicon carbide single crystal 8 grows within the crucible 21, the temperature gradients of the silicon carbide seed crystal substrate 5 and the carbon material required for crystal growth can be maintained at desired values. Further, it becomes possible to eliminate problems such as the problem of a space for growth becoming narrow.

In this case, a method in which the silicon carbide single crystal 8 is pulled up continuously or intermittently at constant intervals is preferable. For example, there may be used a crucible in which there is provided a seed crystal pedestal that is movable in a direction opposite the growth direction of the silicon carbide single crystal 8, so that a sufficient space in the height direction can be secured even when the pedestal moves with growth of the silicon carbide single crystal 8. Further, a mechanism for preventing growth of a silicon carbide single crystal at a moving portion of the seed crystal pedestal moves; i.e., a sliding portion, may be provided. For example, a method in which the pedestal is always rotated, or a method in which the temperature of the sliding portion is set higher than the temperature of the seed crystal may be employed. If the silicon carbide seed crystal substrate 5 is rotated through continuous rotation of the pedestal during the growth of the crystal, temperature, gas composition, and the like are homogenized, so that undesired growth of a crystal is suppressed.

Figure 3:
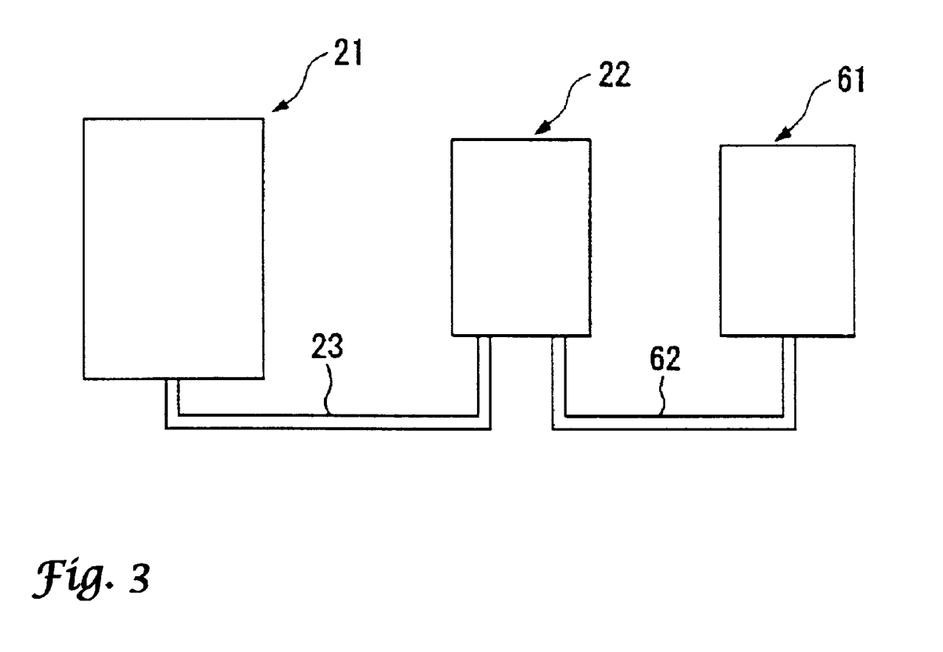
FIG. 3 is a sectional view showing a modification of the reaction apparatus for producing a silicon carbide single crystal according to the first embodiment of the present invention.

FIG. 3 is a schematic structural diagram showing a modification of the reaction apparatus for producing a silicon carbide single crystal according to the present embodiment. In order to continuously supply the silicon 41 into the crucible 21, a second material container 61 is disposed parallel to the material container 22. The material container 22 and the second material container 61 are connected with each other via a silicon introduction tube 62.

The silicon introduction tube 62, which connects the material container 23 and the second material container 61, and the silicon introduction tube 23, which connects the material container 22 and the crucible 21, are heated to at least 1414° C. (the melting point of silicon 41) in order to prevent solidification of the silicon 41. Any heat source may be used insofar as the selected heat source can heat the tubes 23 and 62 to 1414° C. or higher. For example, a graphite heater is preferably used. The heat source is preferably covered with an insulating member of carbon fibers or the like in order to prevent heat loss.

EXAMPLES

Next, non-limiting examples of the process of producing a silicon carbide single crystal will be described. Unless otherwise indicated, all parts, percents, ratios and the like are by weight.

Example 1

A silicon carbide single crystal was grown by use of the reaction apparatus shown in FIG. 1.

The (0001) plane of a 6H-SiC single crystal was machined in order to obtain a silicon carbide seed crystal substrate 5 having a diameter of 20 mm and a thickness of 2.5 mm. The silicon carbide single crystal 5 was attached to the center of the lower surface of the lid plate 32 of the graphite crucible 21. The graphite crucible 21 had an inner diameter of 5 cm and a height of 17 cm.

A carbon plate 34 having a thickness of about 10 mm was disposed in the graphite crucible 21 at a position 8 cm away from the bottom of the crucible 21. The carbon plate 34 was formed of a carbon material having a porosity of 23%, and through holes having a diameter of 1.5 mm were formed in the carbon plate 34 at intervals of 5 mm. Further, graphite granules having an average grain size of about 2 mm were deposited on the carbon plate 34 and at the bottom of the crucible body 31 to a height of 3 cm, so that a carbon layer 35 was formed on the carbon plate 34 and another carbon layer 35 was formed at the bottom of the crucible body 31.

Meanwhile, 200 g of semiconductor grade silicon 41 was placed in the material container 22 made of silicon carbide.

Subsequently, the interior of the housing 41 was depressurized to $10^{-3}$ Torr. After the graphite crucible 21 was heated to 1450° C. and the silicon introduction tube 23 was heated to 1400° C., their temperatures were maintained for about 30 minutes in order to perform heat treatment for removing gas and the like adhering to the crucible 21 and other elements of the apparatus. At this time, the material container 22 was not heated.

Subsequently, the material container 22 was heated to 1700° C., the silicon introduction tube 23 was heated to 1700° C., the carbon layers 35 were heated to 2400° C., and the silicon carbide seed crystal substrate 5 was heated to 2100° C. Subsequently, Ar was introduced into the housing 24 so as to create an Ar atmosphere of 50 Torr, and crystal growth was started.

The tip-end portion of the thus-obtained silicon carbide single crystal had a cross sectional shape approximating a circle, a diameter of 41.4 mm, and a growth length of 15.8 mm. This single crystal was sliced perpendicular to the growth direction, and a sliced piece was polished and then observed under a microscope. The results of observation showed that the single crystal had no inclusions and had crystal defects at a density of $3.5 \times 10/cm^2$. Also, peak positions determined by Raman spectrometry confirmed that the silicon carbide single crystal was 6H silicon carbide and exhibited no polytype.

In the process for producing a silicon carbide single crystal according to the present embodiment, since the melted silicon 41 is introduced from outside the crucible 21 into a carbon material (the carbon plate 34 and the carbon layers 35), the quantity of the silicon 41 supplied can be controlled to a desired amount, so that the proportions of the respective components of a reaction gas can be maintained constant. Consequently, a silicon carbide single crystal in which density and dispersion of crystal defects in a growth direction are reduced and which has constant quality can be grown.

In the apparatus for producing a silicon carbide single crystal according to the present embodiment, the crucible 21 and the material container 22 for storing molten silicon 41 and for elevating and maintaining the temperature of the silicon 41 are connected by the silicon introduction tube 23 for introducing the silicon 41 into the crucible 21 in a molten or vaporized state. Therefore, the silicon 41 in the molten state can be introduced directly into the carbon material within the crucible 21, so that the proportions of the respective components of the reaction gas can be maintained constant. As a result, it becomes possible to stably produce, for a long time, a silicon carbide single crystal in which the density and dispersion of crystal defects in the growth direction are reduced and which has no lattice distortion and constant quality.

Figure 4:
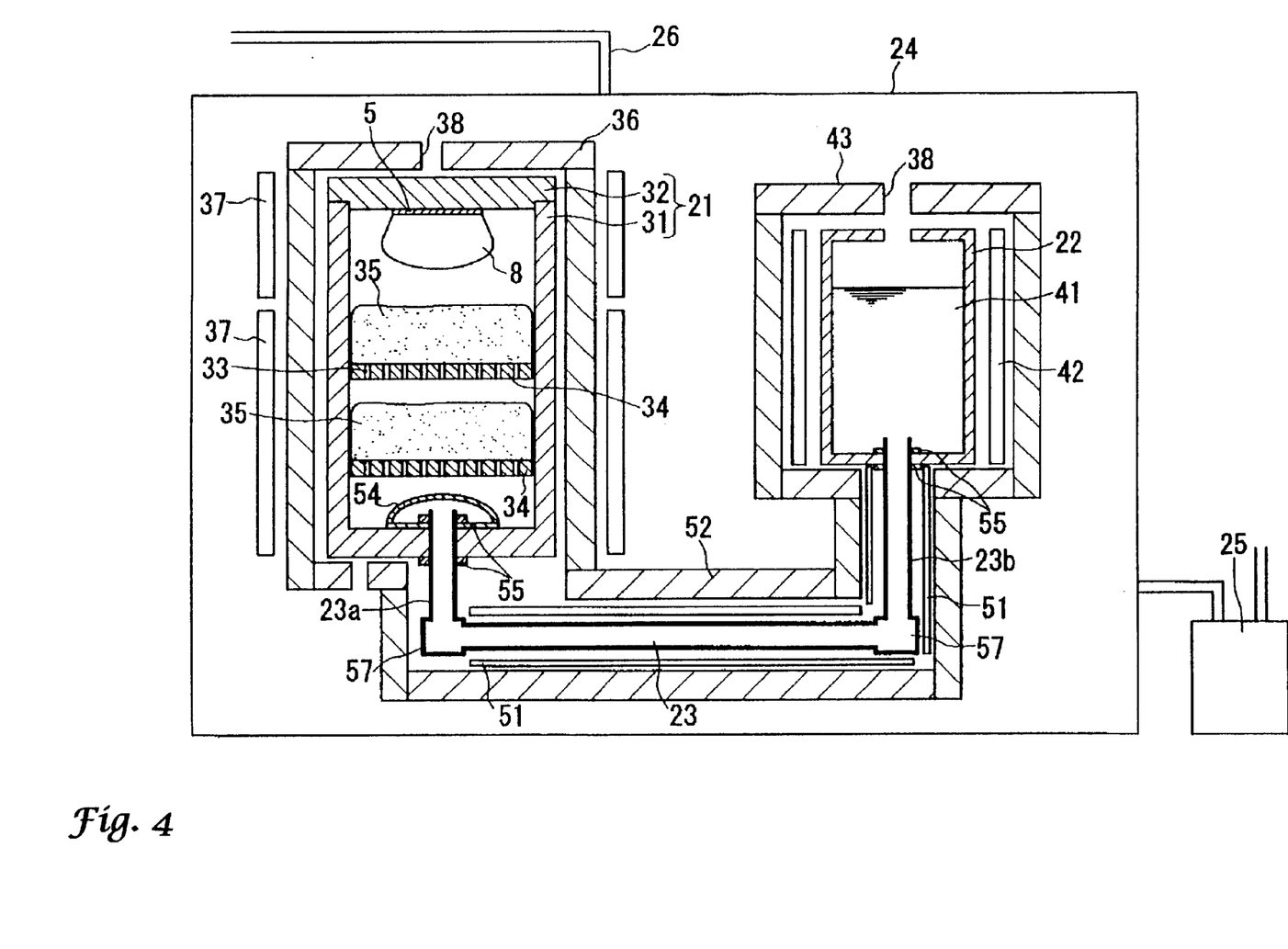
FIG. 4 is a sectional view showing the reaction apparatus for producing a silicon carbide single crystal according to the second embodiment of the present invention.

FIG. 4 is a sectional view showing a reaction apparatus for producing a silicon carbide single crystal according to a second embodiment of the present invention. The reaction apparatus according to the present embodiment differs from that of the first embodiment in that the carbon plate 34 is placed in a plurality of stages (two stages in this drawing) within the crucible body 31, and a carbon layer 35 is disposed on each of the carbon plates 34.

In this case, the through holes 33 of the carbon plates 34 are preferably disposed such that the centers of the through holes 33 of one carbon plate 34 are offset from the centers of the through holes 33 of the other carbon plate 34 to thereby prevent a gas flow from passing straight therethrough and to cause the gas flow to impinge on the carbon plates 34 as many times as possible.

This structure causes efficient contact between the gaseous silicon 41 and the carbon material (the carbon plates 34 and carbon layers 35), whereby a silicon carbide single crystal in which the density and dispersion of crystal defects in the growth direction are decreased and which has constant quality can be grown within a shorter period of time.

Figure 5:
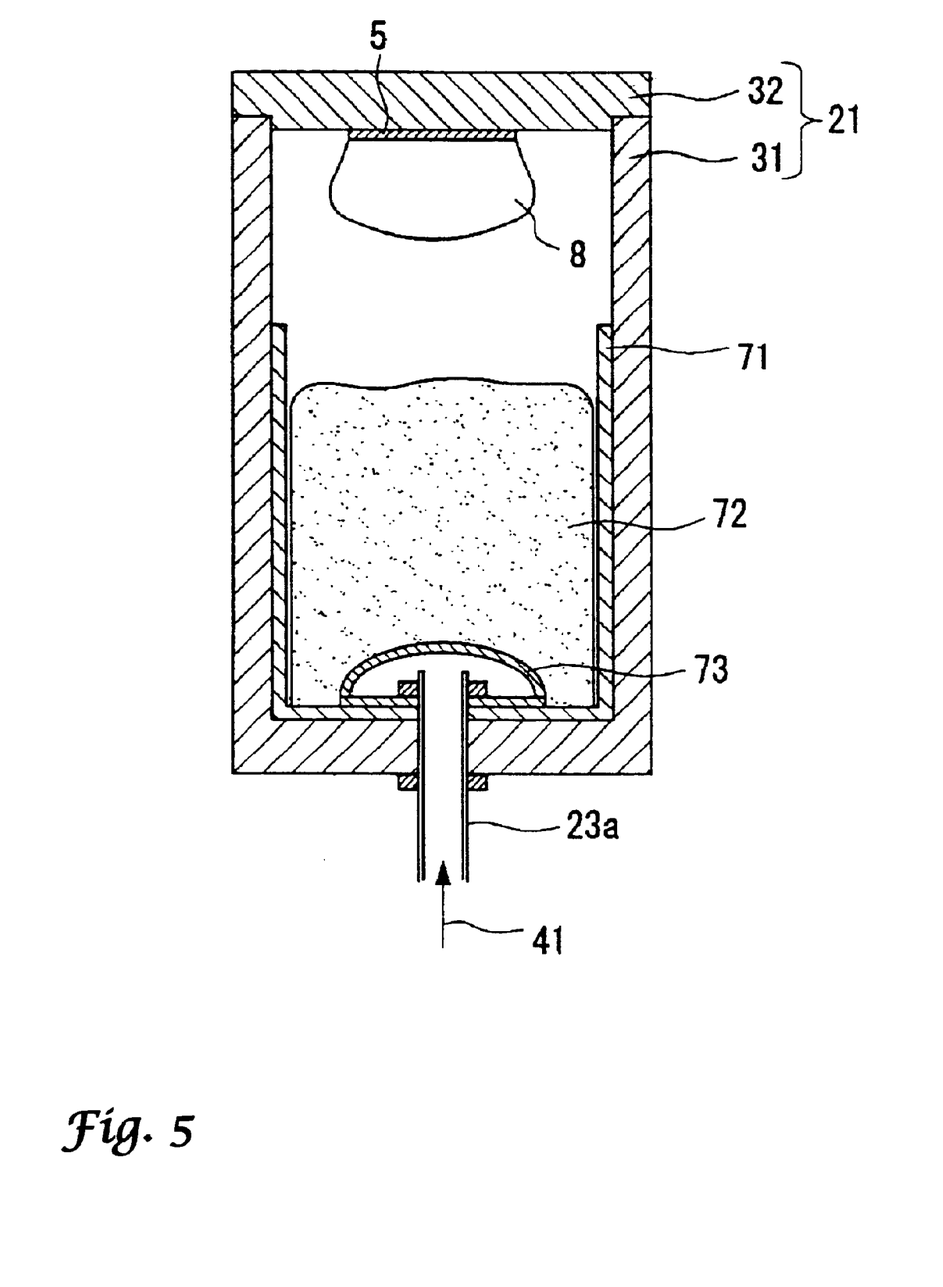
FIG. 5 is a sectional view showing the crucible of the reaction apparatus for producing a silicon carbide single crystal according to the third embodiment of the present invention.

FIG. 5 is a sectional view showing a crucible of a reaction apparatus for producing a silicon carbide single crystal according to a third embodiment of the present invention. The reaction apparatus according to the present embodiment differs from that of the first embodiment in that an inner crucible 71 made of silicon carbide is placed in the crucible body 31, and a powdery/granular carbon material such as graphite granules is deposited as a carbon material 72.

The structure of the crucible is adapted to introduce the molten silicon 41 into the carbon material 72 charged in the inner crucible 71 to thereby cause direct contact between the carbon material 72 and the silicon 41.

At the tip end 23a of the silicon introduction tube is disposed a sparger 73 which is made of silicon carbide and in which a hole of 0.5 mm is formed at two locations.

Next, examples of the process of producing a silicon carbide single crystal will be described.

Example 2

A silicon carbide single crystal was grown by use of the crucible shown in FIG. 5.

The (0001) plane of a 6H-SiC single crystal was machined to thereby obtain a silicon carbide seed crystal substrate 5 having a diameter of 20 mm and a thickness of 2.5 mm. The silicon carbide single crystal 5 was attached to the center of the lower surface of the lid plate 32 of the graphite crucible 21. The graphite crucible 21 had an inner diameter of 5 cm and a height of 15 cm.

An inner crucible 71 made of silicon carbide and having a height of 12 cm was placed in the crucible 21, and graphite granules having an average grain size of about 2 mm were deposited in the inner crucible 71 to a height of 8 cm and used as the carbon material 72.

Subsequently, the interior of the reaction apparatus was depressurized to $10^{-3}$ Torr. After the graphite crucible 21 was heated to 1450° C. and the silicon introduction tube was heated to 1400° C., their temperatures were maintained for about 30 minutes in order to perform heat treatment. At this time, the material container was not heated.

Subsequently, the material container was heated to 1700° C., the silicon introduction tube was heated to 1800° C., the carbon material 72 was heated to about 2600° C., and the silicon carbide seed crystal substrate 5 was heated to 2250° C. Subsequently, Ar was introduced into the reaction apparatus so as to create an Ar atmosphere of 700 Torr, and crystal growth was started.

The tip-end portion of the thus-obtained silicon carbide single crystal had a cross sectional shape approximating a circle, a diameter of 40.4 mm, and a growth length of 11.7 mm. This single crystal was sliced perpendicular to the growth direction, and a sliced piece was polished and then observed under a microscope. The results of observation showed that the single crystal had no inclusions and had crystal defects at a density of $2.3 \times 10/\text{cm}^2$.

Also, peak positions determined by Raman spectrometry confirmed that the silicon carbide single crystal was 6H silicon carbide and exhibited no polytype.

In the present embodiment as well, there can be obtained a silicon carbide single crystal in which the density and dispersion of crystal defects in the growth direction are reduced and which has constant quality, as in the process and apparatus for producing a silicon carbide single crystal according to the first embodiment.

Figure 6:
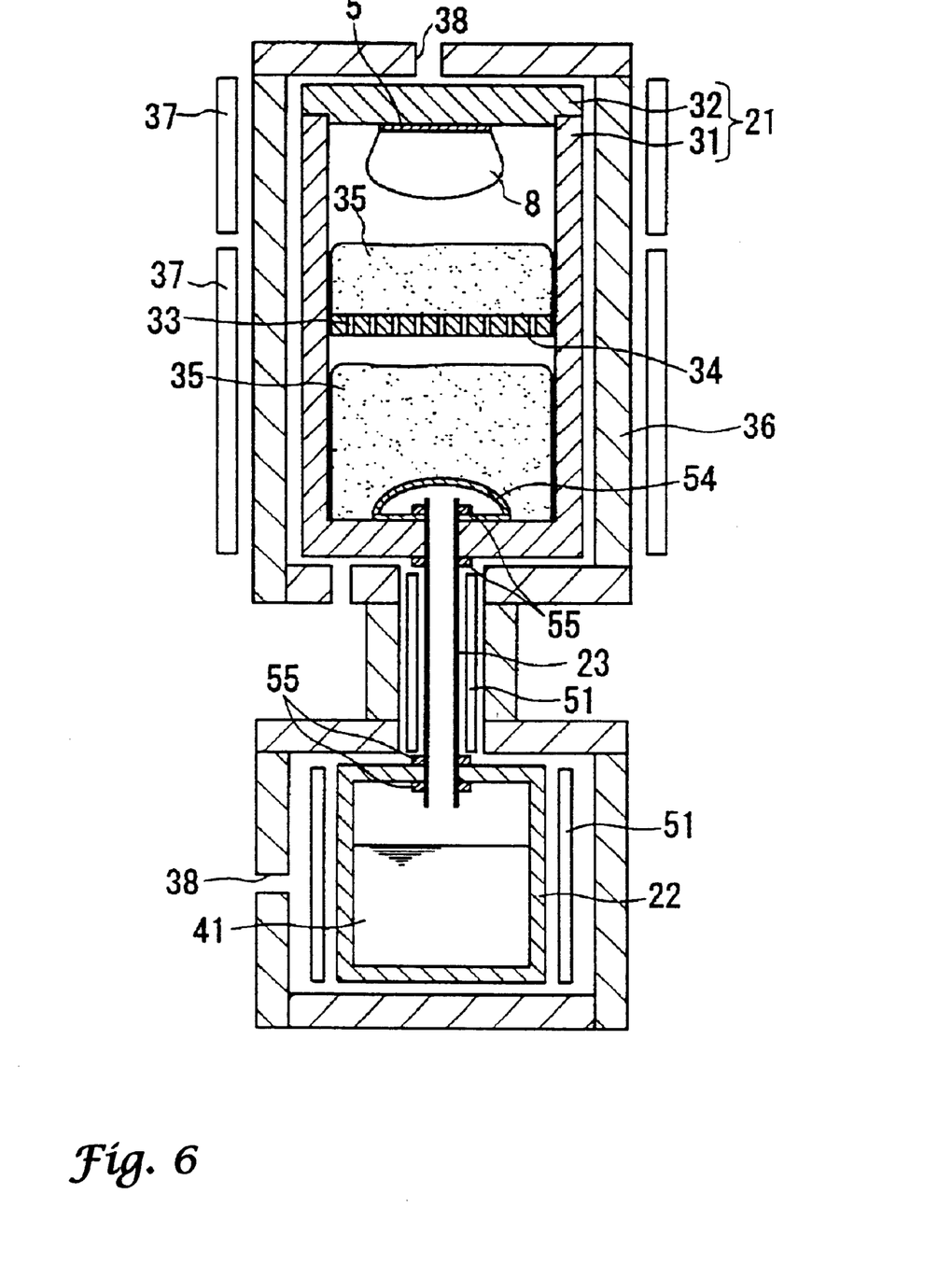
FIG. 6 is a sectional view showing the reaction apparatus for producing a silicon carbide single crystal according to the fourth embodiment of the present invention.

FIG. 6 is a sectional view showing a reaction apparatus for producing a silicon carbide single crystal according to a fourth embodiment of the present invention. The reaction apparatus according to the present embodiment differs from that of the first embodiment in that the material container 22 is disposed directly under the crucible 21, and the crucible 21 and the material container 22 are connected by use of a silicon introduction tube 23 formed of a straight tube in order to introduce silicon gas generated within the material container 22 directly into the carbon layer 35 in the crucible 21.

In this apparatus, the carbon plate 34 is disposed inside the crucible body 31 at the approximate center thereof, and a powdery/granular carbon material such as graphite granules is deposited on the carbon plate 34 and at the bottom of the crucible body 31 in order to form the carbon layers 35.

This structure enables vaporized silicon gas to be introduced directly into the carbon material within the crucible 21, so that the composition proportions of respective components of the reaction gas can be maintained constant. As a result, it becomes possible to reliably produce, over a long period of time, a silicon carbide single crystal in which the density and dispersion of crystal defects in the growth direction are reduced and which has no lattice distortion and constant quality.

Further, since the material container 22 is disposed directly under the crucible 21, the length of the silicon introduction tube 23 can be decreased. As a result, heat radiation from the silicon introduction tube 23 decreases, thereby conserving energy.

Further, since the occupying area can be decreased as compared with the reaction apparatus of the first embodiment, the floor area can be used effectively.

Figure 7:
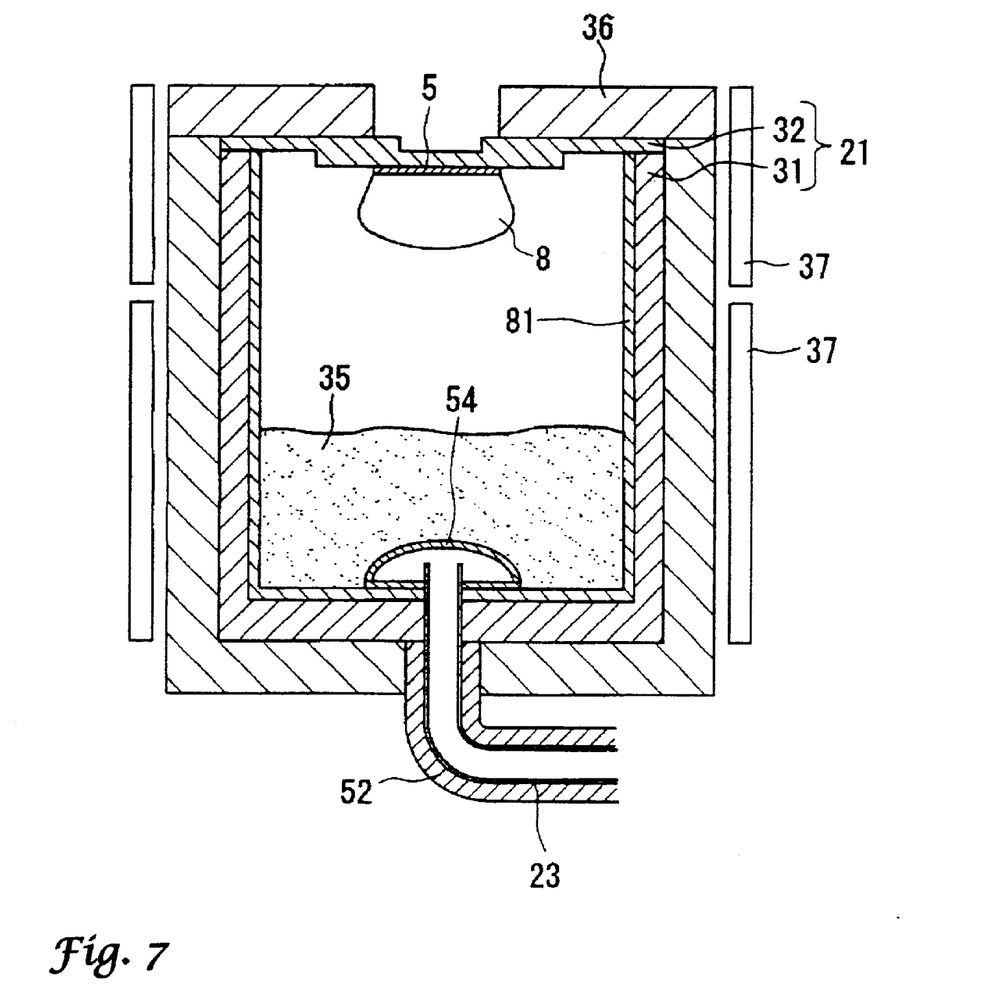
FIG. 7 is a sectional view showing the reaction apparatus for producing a silicon carbide single crystal according to the fifth embodiment of the present invention.

FIG. 7 is a sectional view showing a reaction apparatus for producing a silicon carbide single crystal according to a fifth embodiment of the present invention. The reaction apparatus according to the present embodiment differs from that of the first embodiment in that a silicon carbide film 81 is formed on the inner wall of the crucible body 31.

In this apparatus, since the silicon carbide film 81 is formed on the inner wall of the crucible body 31, the silicon carbide film 81, which has high hardness and excellent heat resistance, protects the inner wall of the crucible body 31, thereby eliminating the fear of the crucible 21 being damaged by silicon.

Accordingly, a fear that upon formation of a hole in the crucible, silicon gas and silicon melt accommodated within the crucible leaks to the outside, leading to a situation in which the production must be stopped can be eliminated. In addition, the expense for purchase of the new crucible for replacement and the time loss caused by an operation of heating the new crucible to a temperature required for crystal growth, which have been considered a problem in the past, can be eliminated. Therefore, drawbacks such as an increase in production costs and a decrease in productivity can be minimized or eliminated.

A process for producing a silicon carbide single crystal according to a sixth embodiment of the present invention will be described.

In this production process, a carbon material and silicon are directly reacted within the crucible. In this case, the crucible is constructed such that the sparger and the carbon material are brought into direct contact within the crucible in order to suppress gasification of molten silicon.

The sparger has a structure such that fine holes are formed radially in a conical member, and the diameter and number of the fine holes are increased.

Further, the internal pressure of the crucible is increased to a level close to normal pressure.

For the carbon material, a porous carbon body having a large specific surface area or a deposition layer of carbon powder or granules is preferably used. The porous carbon body and the carbon powder or granules preferably have a grain size of 100 $\mu$m–5 mm. When the grain size is less than 100 $\mu$m, the passing resistance of a gas reacted with the carbon material may increase. When the grain size is greater than 5 mm, the area of contact between the carbon material and the silicon gas decreases, and the yield of the generated silicon carbide gas decreases, with the result that the growth rate of a single crystal decreases considerably.

Temperature and other conditions may be set to be substantially the same as those in the production process of the first embodiment.

A process for producing a silicon carbide single crystal according to a seventh embodiment of the present invention will be described.

In this production process, silicon converted to a gas in the material container is introduced into the crucible, and since silicon gas is introduced into the crucible, temperature control becomes easier as compared with the case where silicon gas is generated within the crucible.

In this case, in order to vaporize silicon within the material container, the material container is preferably maintained at 1800–2400° C., and the pressure is preferably set to 1–100 Torr.

With regard to supply of gas, the material container is preferably disposed directly under the crucible, and an introduction tube is preferably connected to the material container and the crucible in series. The introduction tube is preferably made of silicon carbide or a graphite material coated with silicon carbide, because silicon gas whose temperature is higher than silicon melt contacts the introduction tube. A heating scheme similar to that employed in the first embodiment may be used for heating the introduction tube.

Embodiments of the present invention have been described with reference to the drawings. However, the specific structure is not limited to the embodiments, and the design thereof may be modified without departing from the scope of the present invention.

For example, the layout of the crucible 21, the material container 22, and the silicon introduction tube 23, and the number of the carbon layers 35 may be changed freely.

Further, an apparatus for supplying a carbon material into the crucible or the like may be attached in order to cope with reduction of the carbon material. In this case, in order to maintain the purity of the environment within the crucible, the production apparatus preferably has a structure such that the carbon material is transported into an auxiliary chamber; after the auxiliary chamber is evacuated, a gas for creating a growth atmosphere is introduced into the auxiliary chamber; and subsequently, the carbon material is supplied from the auxiliary chamber into the crucible.

Further, a structure in which control means for controlling the introduction amount of the silicon material is provided for the silicon introduction tube or the material container to thereby control the amount of the silicon material introduced into the carbon material may be employed.

Further, when a doping agent is mixed into the silicon material within the material chamber, a silicon carbide single crystal containing the doping agent can be grown.

Moreover, a doping element may be supplied to the crucible in a vaporized state.

As described in the foregoing, in the process for producing a silicon carbide single crystal according to the present invention, a melted or vaporized silicon material is introduced from the outside of a reaction system into a carbon material heated to a temperature equal to or higher than a temperature at which the silicon material vaporizes, whereby the quantity of the silicon material supplied with respect to the carbon material is controlled to a desired amount. This enables the proportions of the respective components of a reaction gas to be maintained constant.

Accordingly, a high quality silicon carbide single crystal in which density and dispersion of crystal defects in a growth direction are reduced and which has constant quality can be grown.

The apparatus for producing a silicon carbide single crystal according to the present invention comprises: a crucible which stores a carbon material and has a top portion having a lower surface to which a silicon carbide seed crystal substrate is attached; heating means for elevating and maintaining the temperature of the crucible; a material container for storing a silicon material and for elevating and maintaining the temperature of the silicon material; and a silicon introduction tube for introducing from the material container into the crucible the silicon material in a molten or vaporized state. Therefore, the silicon material in a molten or vaporized state can be introduced directly into the carbon material stored in the crucible. As a result, a high quality silicon carbide single crystal in which the density and dispersion of crystal defects in the growth direction are reduced and which has no lattice distortion and constant quality can be produced continuously under stable conditions.

While the invention has been described in detail and with reference to specific embodiments thereof, it will be apparent to one skilled in the art that various changes and modifications can be made therein without departing from the spirit and scope thereof.

What is claimed is:

1. A process for producing a silicon carbide single crystal, comprising introducing a melted silicon material from the outside of a reactor system into a carbon material heated to a temperature equal to or higher than a temperature at which said silicon material vaporizes; and causing a reaction gas containing silicon gas and silicon carbide gas generated by a reaction between said carbon material and said melted silicon material to reach a silicon carbide seed crystal substrate which is held at a temperature lower than that of said carbon material, so that a silicon carbide single crystal grows on said silicon carbide seed crystal substrate.

2. The process for producing a silicon carbide single crystal according to claim 1, wherein said carbon material contains silicon carbide.

3. The process for producing a silicon carbide single crystal according to claim 1, wherein the temperature range of said silicon carbide seed crystal substrate is 1500–2500° C., and the temperature range of said carbon material is set such that the temperature of said carbon material is higher than that of said silicon carbide seed crystal substrate, and the temperature difference between said carbon material and said silicon carbide seed crystal substrate does not exceed 400° C.

4. The process for producing a silicon carbide single crystal according to claim 1, wherein the process comprises supplying said silicon material and/or said carbon material continuously or intermittently.

5. The process for producing a silicon carbide single crystal according to claim 1, wherein said process comprises growing said silicon carbide single crystal simultaneously with a discharging of the reaction gas to the outside of the reaction system and/or moving of said grown silicon carbide single crystal to the outside of the reaction system in a volume corresponding to the volume of said introduced silicon material.

6. An apparatus for producing a stoichiometric silicon carbide single crystal, comprising a crucible which stores a carbon material and has a top portion having a lower surface to which a silicon carbide seed crystal substrate is attached; wherein at least the inner wall of the crucible is formed of silicon carbide;

heating means for elevating and maintaining the temperature of said crucible;

a material container for storing a silicon material and for elevating and maintaining the temperature of said silicon material; and a silicon introduction tube for introducing from said material container into said crucible said silicon material in a molten state, wherein at least the inner wall of said silicon introduction tube is formed of silicon carbide.

7. The apparatus for producing a silicon carbide single crystal according to claim 6, wherein said carbon material is disposed at a plurality of stages provided along the flow direction of said silicon-material.

8. The apparatus for producing a silicon carbide single crystal according to claim 6, wherein said heating means comprises a first heating means for elevating and maintaining the temperature of said carbon material and a second heating means controlled independently of said first heating means and adapted to elevate and maintain the temperature of said silicon carbide seed crystal substrate.

* * * * *